United States Patent
Xie

(10) Patent No.: US 11,694,752 B2
(45) Date of Patent: Jul. 4, 2023

(54) CLOCK SIGNAL RETURN SCHEME FOR DATA READ IN PAGE BUFFER OF MEMORY DEVICE

(71) Applicant: YANGTZE MEMORY TECHNOLOGIES CO., LTD., Wuhan (CN)

(72) Inventor: Shu Xie, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 210 days.

(21) Appl. No.: 17/334,131

(22) Filed: May 28, 2021

(65) Prior Publication Data
US 2022/0351783 A1 Nov. 3, 2022

Related U.S. Application Data

(63) Continuation of application No. PCT/CN2021/090444, filed on Apr. 28, 2021.

(51) Int. Cl.
| | |
|---|---|
| *G11C 7/00* | (2006.01) |
| *G11C 16/26* | (2006.01) |
| *G11C 16/04* | (2006.01) |
| *G11C 16/32* | (2006.01) |
| *G11C 11/56* | (2006.01) |

(Continued)

(52) U.S. Cl.
CPC ......... *G11C 16/26* (2013.01); *G11C 16/0483* (2013.01); *G11C 16/32* (2013.01); *G11C 11/5621* (2013.01); *G11C 11/5671* (2013.01); *H10B 41/35* (2023.02); *H10B 43/35* (2023.02)

(58) Field of Classification Search
CPC ......... G11C 7/1051; G11C 7/22; G11C 7/106; G11C 7/1057
USPC ........................... 365/189.05, 233.11, 233.19
See application file for complete search history.

(56) References Cited

U.S. PATENT DOCUMENTS

| | | | |
|---|---|---|---|
| 11,380,386 B2 * | 7/2022 | Lee ...................... G11C 16/32 |
| 2005/0135183 A1 | 6/2005 | Kondo | |

FOREIGN PATENT DOCUMENTS

| | | |
|---|---|---|
| CN | 1812318 A | 8/2006 |
| CN | 107547087 A | 1/2018 |
| CN | 108572785 A | 9/2018 |

(Continued)

OTHER PUBLICATIONS

International Search Report issued in corresponding International Application No. PCT/CN2021/090444, dated Jan. 26, 2022, 4 pages.

*Primary Examiner* — Son T Dinh
(74) *Attorney, Agent, or Firm* — Bayes PLLC

(57) ABSTRACT

In certain aspects, a circuit includes a page buffer including a plurality of portions, a clock path coupled to the plurality of portions of the page buffer, and a clock level set module coupled to the page buffer. Each of the portions is configured to sequentially receive a clock signal, and sequentially return a clock return signal in response to receiving the corresponding clock signal. The clock path is configured to merge the plurality of clock return signals. The clock level set module is configured to set a start level of a first clock return signal of the plurality of clock return signals based on a number of cycles in a first clock signal of the plurality of clock signals. The first clock return signal corresponds to the first clock signal.

20 Claims, 13 Drawing Sheets

(51) Int. Cl.
*H10B 41/35* (2023.01)
*H10B 43/35* (2023.01)

(56) References Cited

FOREIGN PATENT DOCUMENTS

CN 111386569 A 7/2020
KR 101027759 B1 4/2011

* cited by examiner

CLOCK SIGNAL RETURN SCHEME FOR DATA READ IN PAGE BUFFER OF MEMORY DEVICE

CROSS-REFERENCE TO RELATED APPLICATIONS

This application is continuation of International Application No. PCT/CN2021/090444, filed on Apr. 28, 2021, entitled "CLOCK SIGNAL RETURN SCHEME FOR DATA READ IN PAGE BUFFER OF MEMORY DEVICE," which is hereby incorporated by reference in its entirety.

BACKGROUND

The present disclosure relates to memory devices and operations thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a circuit includes a page buffer including a plurality of portions, a clock path coupled to the plurality of portions of the page buffer, and a clock level set module coupled to the page buffer. Each of the portions is configured to sequentially receive a clock signal, and sequentially return a clock return signal in response to receiving the corresponding clock signal. The clock path is configured to merge the plurality of clock return signals. The clock level set module is configured to set a start level of a first clock return signal of the plurality of clock return signals based on a number of cycles in a first clock signal of the plurality of clock signals. The first clock return signal corresponds to the first clock signal.

In another aspect, a system includes a memory device including a memory cell array configured to store data, and a peripheral circuit coupled to the memory cell array and configured to perform a read operation on the memory cell array to read the stored data. The peripheral circuit includes a page buffer including a plurality of portions, a clock path coupled to the plurality of portions of the page buffer, and a clock level set module coupled to the page buffer. Each of the portions is configured to sequentially receive a clock signal, and sequentially return a clock return signal in response to receiving the corresponding clock signal. The clock path is configured to merge the plurality of clock return signals. The clock level set module is configured to set a start level of a first clock return signal of the plurality of clock return signals based on a number of cycles in a first clock signal of the plurality of clock signals. The first clock return signal corresponds to the first clock signal.

In still another aspect, a memory device includes a memory cell array configured to store data, and a peripheral circuit coupled to the memory cell array and configured to perform a read operation on the memory cell array to read the stored data. The peripheral circuit includes a page buffer including a plurality of portions, a clock path coupled to the plurality of portions of the page buffer, and a clock level set module coupled to the page buffer. Each of the portions is configured to sequentially receive a clock signal, and sequentially return a clock return signal in response to receiving the corresponding clock signal. The clock path is configured to merge the plurality of clock return signals. The clock level set module is configured to set a start level of a first clock return signal of the plurality of clock return signals based on a number of cycles in a first clock signal of the plurality of clock signals. The first clock return signal corresponds to the first clock signal.

In yet another aspect, a method for operating a memory device is disclosed. The memory device includes a page buffer. A read instruction is received. An address of the page buffer in the read instruction is obtained. A parity of a number of cycles in a first clock signal is determined based on the address. The first clock signal is received by a first portion of the page buffer. A start level of a first clock return signal is set based on the parity. The first clock return signal is returned by the first portion of the page buffer in response to receiving the first clock signal.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
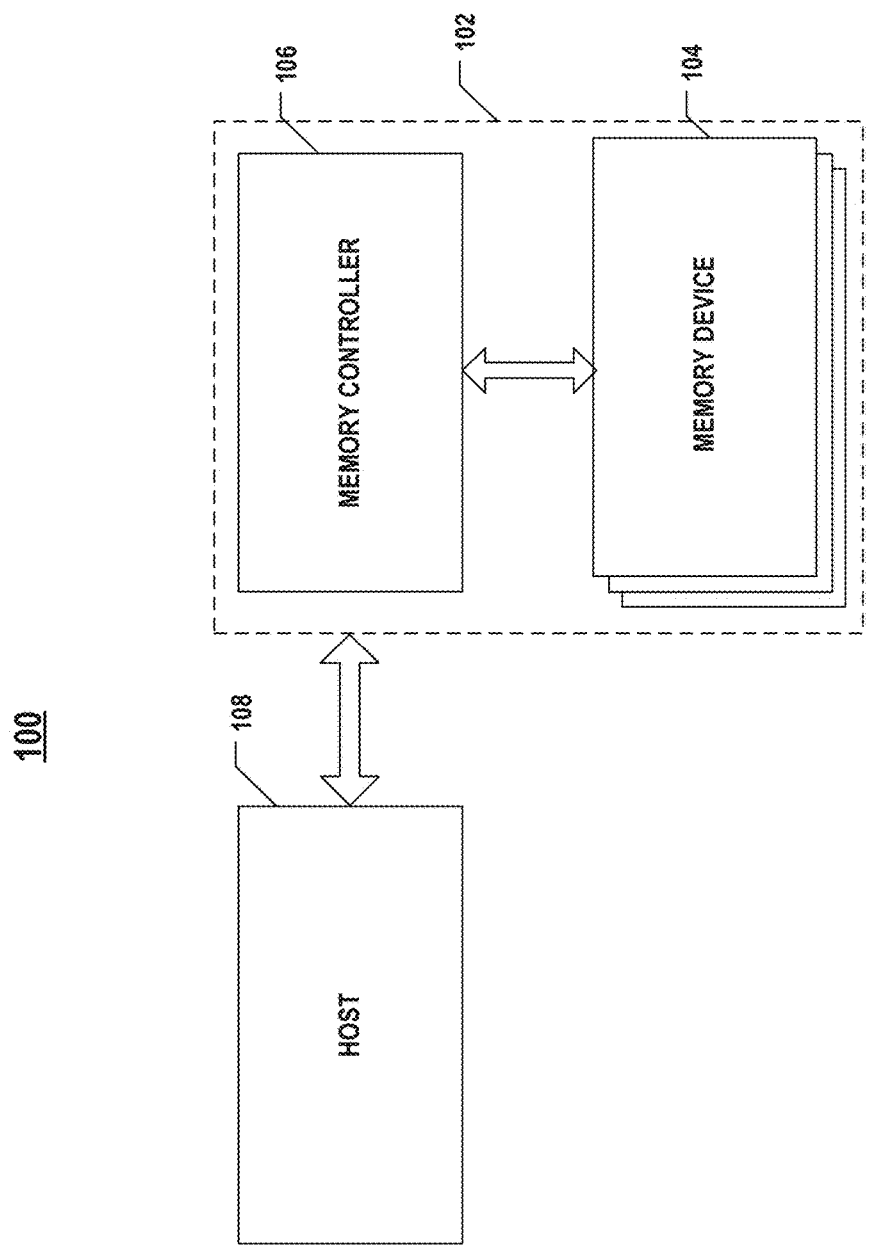
FIG. 1 illustrates a block diagram of an exemplary system having a memory device, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosure can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Some memory devices, such as NAND Flash memory devices, can perform read operations at the page level, i.e., reading all the memory cells in the same selected page at the same time. Page buffers are used by NAND Flash memory devices for buffering the read-out data between the memory cell array and the data bus in read operations. A page buffer of a certain memory plane is divided into multiple portions, such as four quarters, each of which has its own clock path and data patch that will finally merge together to output from the NAND Flash memory device.

Since NAND Flash memory devices work at very high frequencies, to track the read-out data, the clock signal that sent the column address to the memory plane will return along with the read-out data as a clock return signal according to a clock signal return scheme (a.k.a., wave pipeline structure). As the page buffer quarters need to switch when the data reading from the current select quarter is finished, the return clock signals also need to switch from quarter to quarter. However, due to the process and operating condition variations (e.g., process, voltage, temperature, etc.) among different quarters, the duration of transmitting each clock return signal also varies. Thus, it is challenging to merge the clock return signals from the four page buffer quarters.

According to some known clock signal return schemes, when merging the clock return signals of different quarters, in order not to gate other quarters' clock return signals, the level of each clock return signal has to return to low at the end. That is, each clock return signal includes short pulses according to those known schemes. The issue of using the short pulse for the clock return signal is that the short pulse needs to pass along a long routing line of the clock path, which becomes difficult to control considering the process and operating condition variations among different quarters.

To address one or more of the aforementioned issues, the present disclosure introduces a solution in which the short pulse is avoided for clock return signals while still not gating other clock return signals from other portions of the page buffer during the switch between different portions of the page buffer. Depending on the type of logic gate used in the clock path for merging different clock return signals, for example, an OR gate or a NAND gate, the clock return signal returned from the current select portion can be ensured to finish at a particular level (e.g., low for OR gate and high for NAND gate) that will not gate another clock return signal next to it. As a result, a frequency divider can be used at the beginning of the clock path to increase the period of the clock return signal to avoid using short pulses for clock return signals. In some implementations, to ensure the desired end level of the clock return signal from the current select portion of the page buffer, the parity of the number of cycles in the clock return signal is determined and used to set the start level of the clock return signal. In some implementations, since the clock cycles correspond to the read-out data cycles to be transferred in the current select portion, the parity of the number of clock cycles can be determined based on the address of the read-out data from the current select portion of the page buffer as indicated in the read instruction. As a result, the clock return signals can be more easily controlled even over a long routing and with the process and operating condition variations among different portions of the page buffer, thereby achieving a seamless switch between different portions. Moreover, the tracking between data and clock signals over data path and clock path become more easily as well by using the clock signal return scheme disclosed herein, compared with the known clock signal return schemes.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be coupled to memory controller 106 and configured to send or receive data to or from memory devices 104 through memory controller 106. For example, host 108 may send the program data in a program operation or receive the read data in a read operation.

Memory device 104 can be any memory device disclosed in the present disclosure, such as a NAND Flash memory device, which includes a page buffer having multiple portions, for example, four quarters. Consistent with the scope of the present disclosure, depending on the type of logic gate used in the clock path for merging different clock return signals, for example, an OR gate or a NAND gate, the clock return signal returned from the current select portion can be ensured to finish at a particular level (e.g., low for OR gate and high for NAND gate) that will not gate another clock return signal next to it. As a result, a frequency divider can be used at the beginning of the clock path to increase the period of the clock return signal to avoid using short pulses for clock return signals.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations, by providing instructions, such as read instructions, to memory device 104. For example, memory controller 106 may be configured to provide a read instruction to the peripheral circuit of memory device 104 to control the read operation. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104.

Memory controller 106 can communicate with an external device (e.g., host 108) according to a particular communication protocol. For example, memory controller 106 may communicate with the external device through at least one of various interface protocols, such as a USB protocol, an MIVIC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
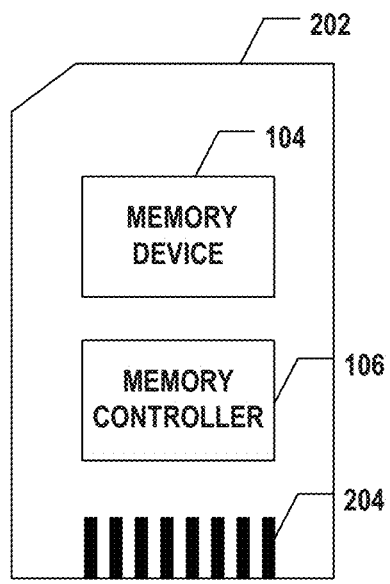
FIG. 2A illustrates a diagram of an exemplary memory card having a memory device, according to some aspects of the present disclosure.
Figure 2B:
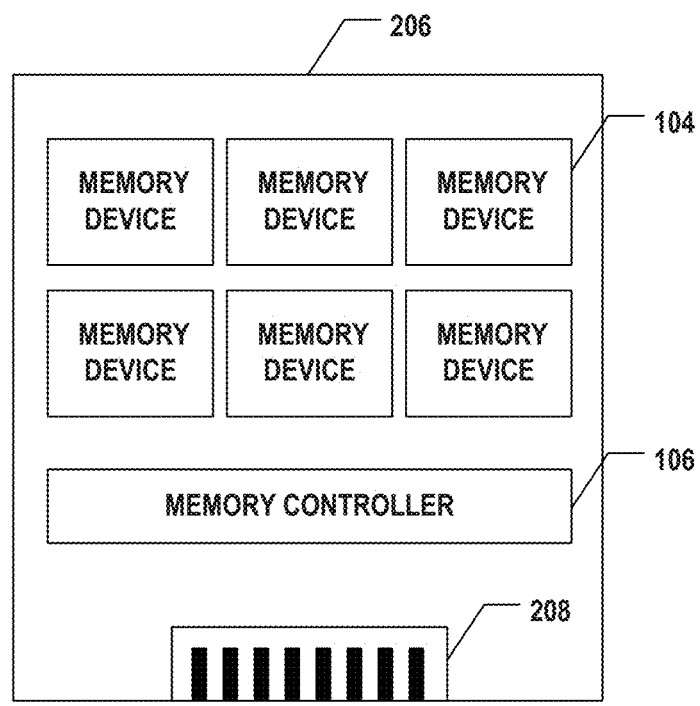
FIG. 2B illustrates a diagram of an exemplary solid-state drive (SSD) having a memory device, according to some aspects of the present disclosure.

Memory controller 106 and one or more memory devices 104 can be integrated into various types of storage devices, for example, being included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
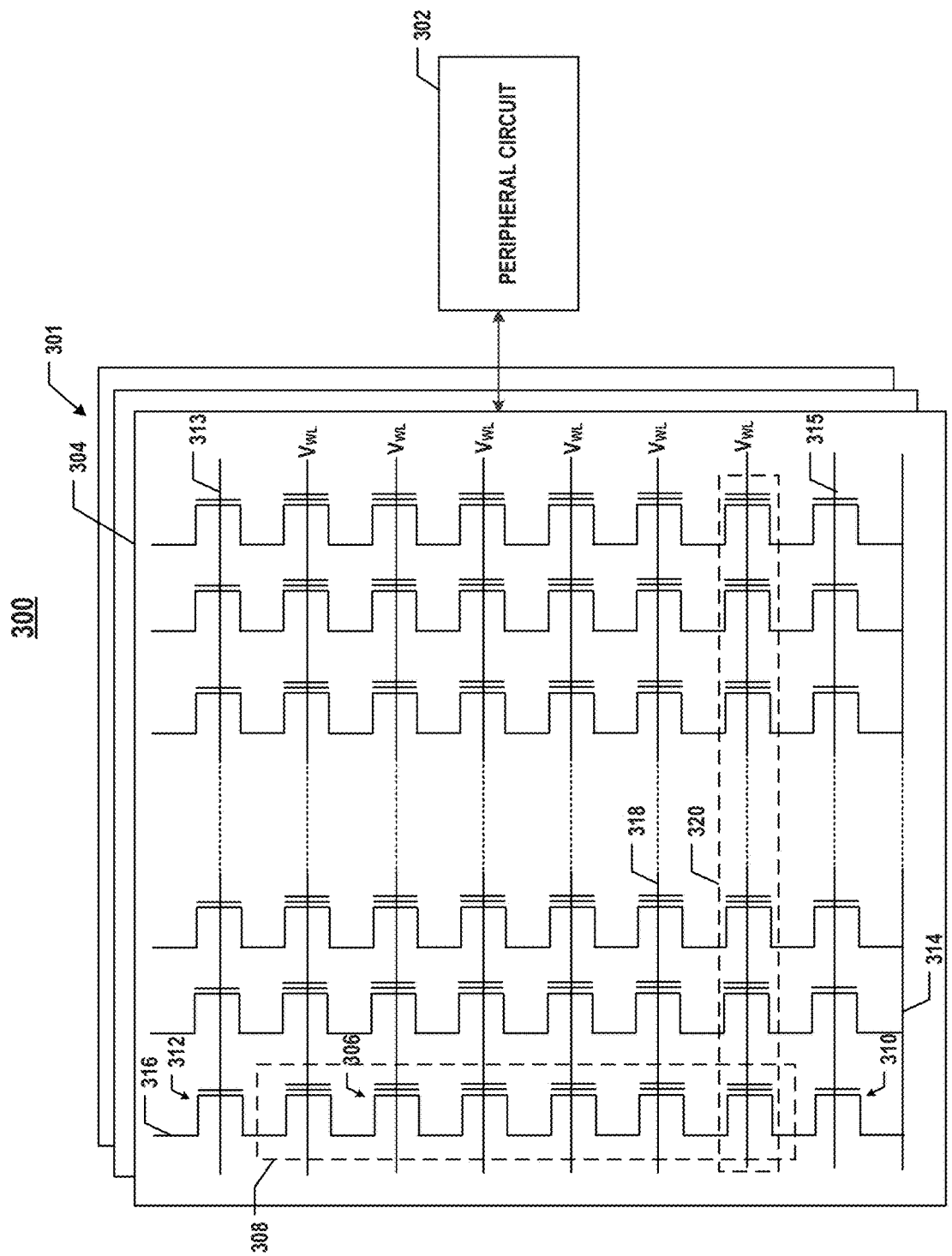
FIG. 3 illustrates a schematic diagram of an exemplary memory device including peripheral circuits, according to some aspects of the present disclosure.

FIG. 3 illustrates a schematic circuit diagram of an exemplary memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, which depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can include a source select gate (SSG) transistor 310 at its source end and a drain select gate (DSG) transistor 312 at its drain end. SSG transistor 310 and DSG transistor 312 can be configured to activate selected NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (AC S), according to some implementations. The drain of DSG transistor 312 of each NAND memory string 308 is coupled to a respective bit line 316 from which data can be read or written via an output bus (not shown), according to some implementations. In some implementations, each NAND memory string 308 is configured to be selected or deselected by applying a select voltage (e.g., above the threshold voltage of DSG transistor 312) or a deselect voltage (e.g., 0 V) to the gate of respective DSG transistor 312 through one or more DSG lines 313 and/or by applying a select voltage (e.g., above the threshold voltage of SSG transistor 310) or a deselect voltage (e.g., 0 V) to the gate of respective SSG transistor 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a selected block 304, source lines 314 coupled to selected block 304 as well as unselected blocks 304 in the same plane as selected block 304 can be biased with an erase voltage (Vers), such as a high positive voltage (e.g., 20 V or more). Memory cells 306 of adjacent NAND memory strings 308 can be coupled through word lines 318 that select which row of memory cells 306 is affected by the read and program operations. In some implementations, each word line 318 is coupled to a page 320 of memory cells 306, which is the basic data unit for the program and read operations. The size of one page 320 in bits can relate to the number of NAND memory strings 308 coupled by word line 318 in one block 304. Each word line 318 can include a plurality of control gates (gate electrodes) at each memory cell 306 in respective page 320 and a gate line coupling the control gates.

Figure 4:
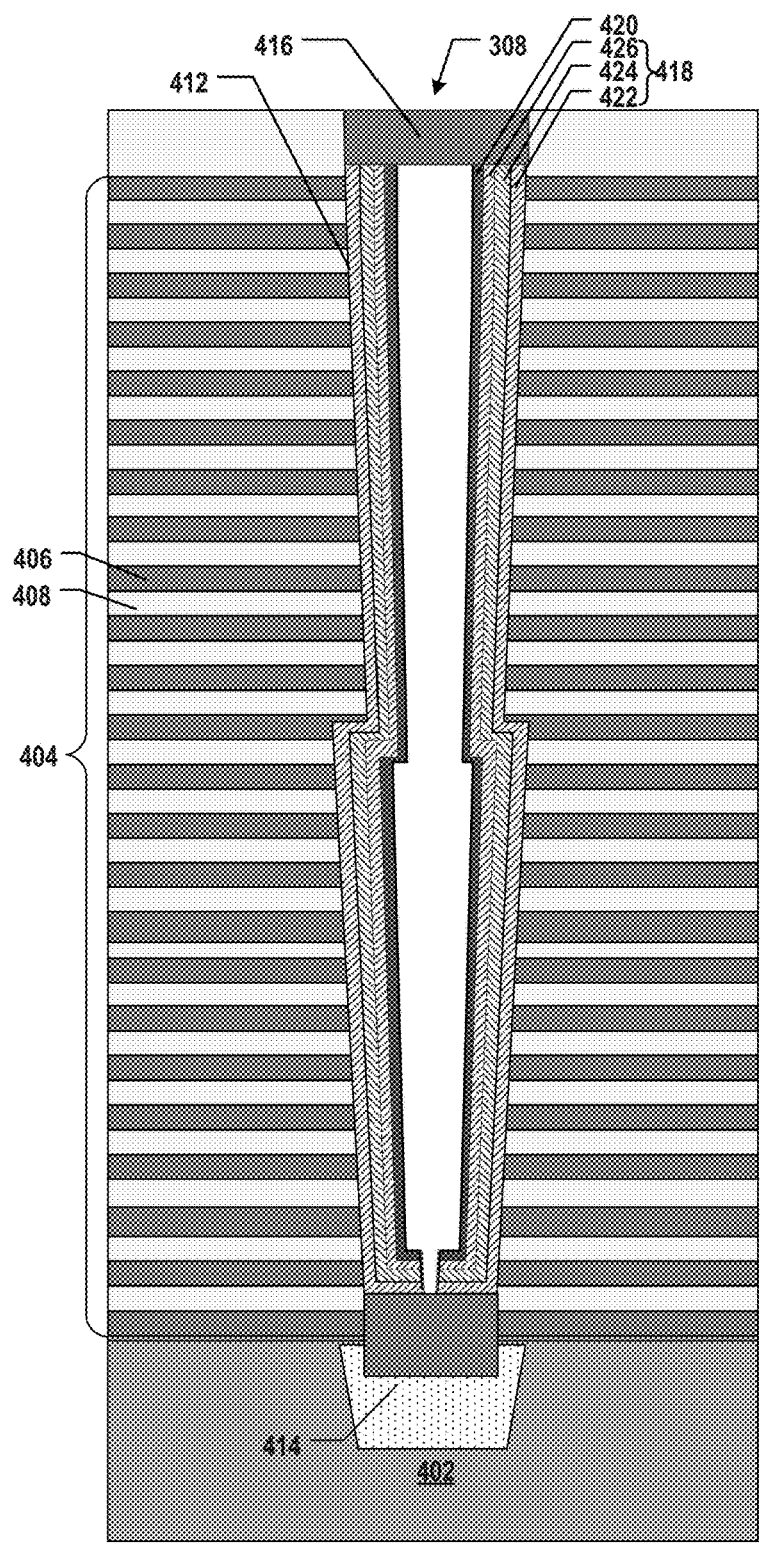
FIG. 4 illustrates a side view of a cross-section of an exemplary memory cell array including a NAND memory string, according to some aspects of the present disclosure.

FIG. 4 illustrates a side view of a cross-section of an exemplary memory cell array 301 including NAND memory strings 308, according to some aspects of the present disclosure. As shown in FIG. 4, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include control gates surrounding memory cells 306, the gates of DSG transistors 312, or the gates of SSG transistors 310, and can extend laterally as DSG line 313 at the top of memory stack 404, SSG line 315 at the bottom of memory stack 404, or word line 318 between DSG line 313 and SSG line 315.

As shown in FIG. 4, NAND memory string 308 includes a channel structure 412 extending vertically through memory stack 404. In some implementations, channel structure 412 includes a channel hole filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap/storage layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4, a well 414 (e.g., a P-well and/or an N-well) is formed in substrate 402, and the source end of NAND memory string 308 is in contact with well 414, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end of NAND memory string 308.

Figure 5:
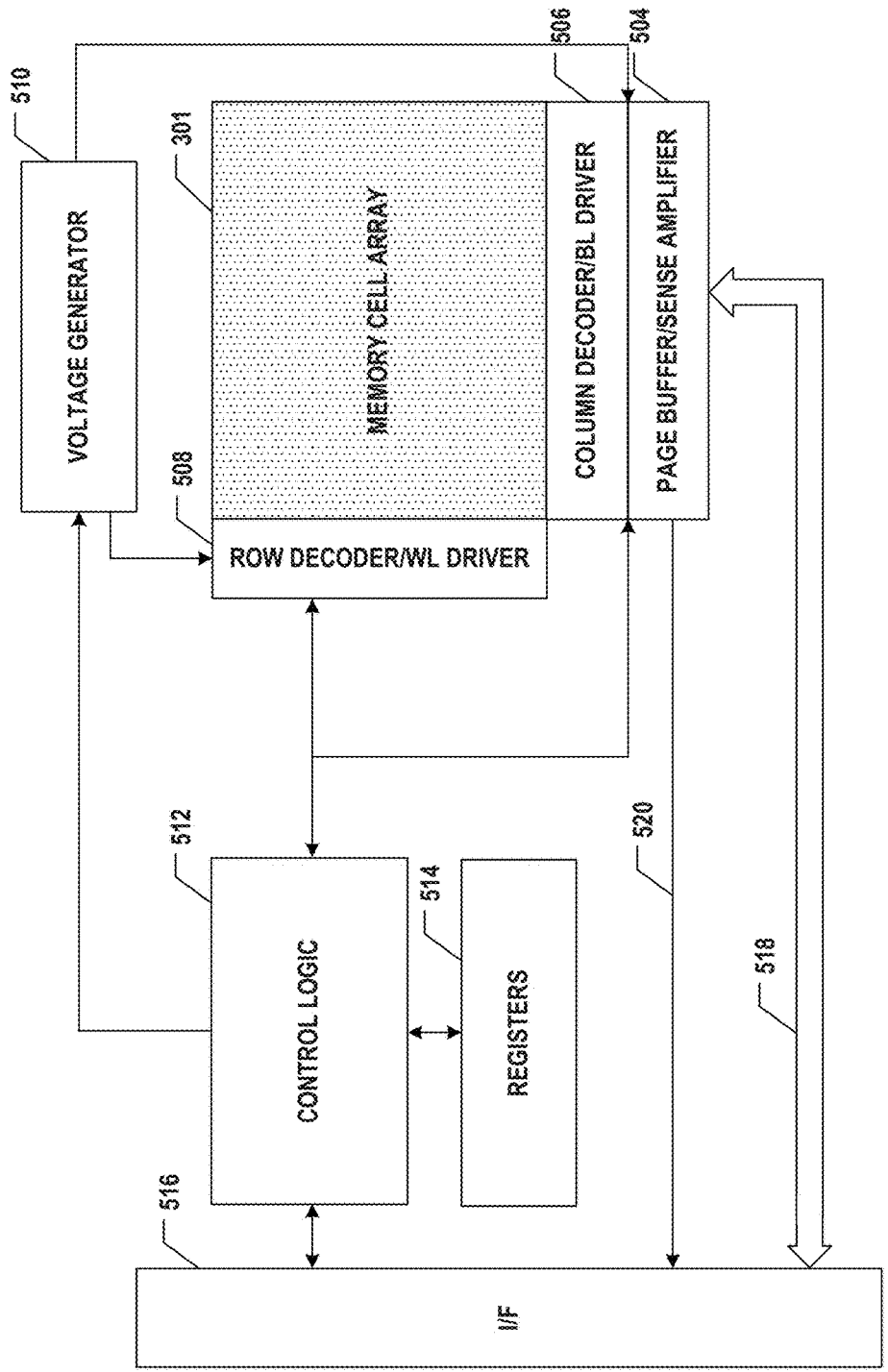
FIG. 5 illustrates a block diagram of an exemplary memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may perform program verify operations to ensure that the data has been properly programmed into memory cells 306 coupled to selected word lines 318. In still another example, page buffer/sense amplifier 504 may also sense the low power signals from bit line 316 that represents a data bit stored in memory cell 306 and amplifies the small voltage swing to recognizable logic levels in a read operation. As described below in detail, page buffer/sense amplifier 504 can include a plurality of physically separated portions (e.g., four quarters) that can be sequentially accessed through its own clock path and data path in read operations.

Column decoder/bit line driver 506 can be configured to be controlled by control logic 512 according to the control signals from control logic 512 and select one or more NAND memory strings 308 by applying bit line voltages generated from voltage generator 510. As described below in detail, in read operations, the control signals can include read commands that include addresses (e.g., column addresses) each identifying read-out data starting from one of the portions of page buffer/sense amplifier 504.

Row decoder/word line driver 508 can be configured to be controlled by control logic 512 according to the control signals from control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315 and DSG lines 313 as well. Voltage generator 510 can be configured to be controlled by control logic 512 according to the control signals from control logic 512 and generate the word line voltages (e.g., read voltage, program voltage, pass voltage, local voltage, verification voltage, etc.), bit line voltages, and source line voltages to be supplied to memory cell array 301.

Control logic 512 can be coupled to each peripheral circuit described above and configured to control the operations of each peripheral circuit by generating and sending various control signals, such as read commands for read operations. Control logic 512 can also send clock signals at desired frequencies, periods, and duty cycles to other peripheral circuits 302 to orchestrate the operations of each peripheral circuit 302, for example, for synchronization. Registers 514 can be coupled to control logic 512 and include status registers, command registers, and address registers for storing status information, command operation codes (OP codes), and command addresses for controlling the operations of each peripheral circuit 302.

Interface 516 can be coupled to control logic 512 and act as an instruction fetcher/buffer as well as an instruction decoder to decode instructions received from a memory controller (e.g., 106 in FIG. 1) and relay the decoded instructions to control logic 512. Interface 516 can also buffer and relay status information received from control logic 512 to the memory controller (e.g., 106 in FIG. 1). Interface 516 can be coupled to page buffer/sense amplifier 504 via data bus 518 and further act as a data input/output (I/O) interface and a data buffer to buffer and relay the data to and from memory cell array 301.

As described below in detail, peripheral circuits 302 can further include a clock path 520 coupled to and from each portion of page buffer/sense amplifier 504 and configured to transfer and merge multiple clock return signals from multiple portions of page buffer/sense amplifier 504 in a read operation according to the clock signal return schemes disclosed herein. Clock path 520 can be coupled to interface 516 as well to transfer the merged clock return signals to interface 516 in order to synchronize the output of the read-out data from data bus 518 in read operations. In some implementations, the merged clock return signal on clock path 520 is aligned with the read-out data on data bus 518 in a read operation.

Figure 6:
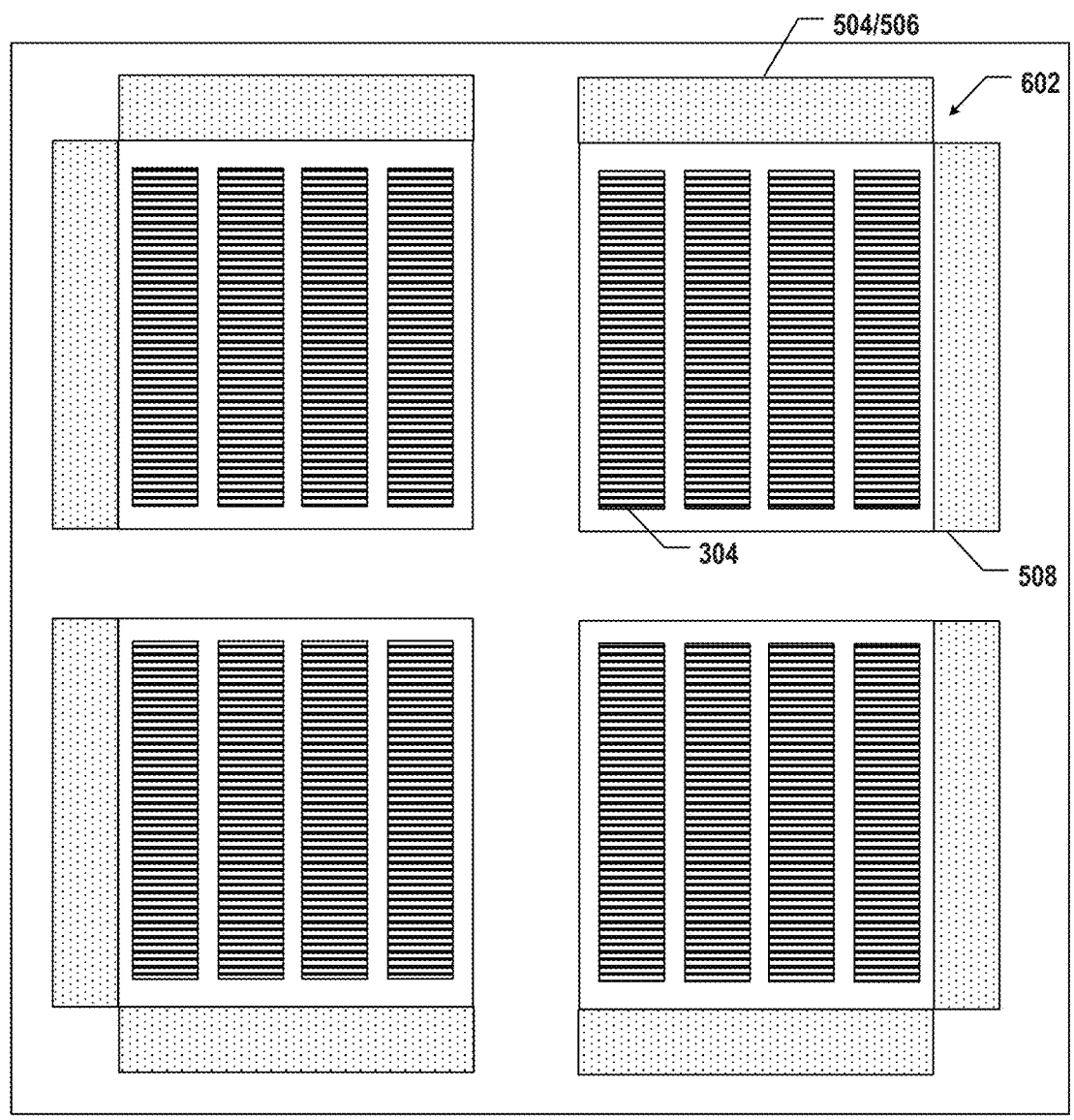
FIG. 6 illustrates a block diagram of an exemplary memory device including multiple memory planes, according to some aspects of the present disclosure.

FIG. 6 illustrates a block diagram of exemplary memory device 300 including multiple memory planes, according to some aspects of the present disclosure. In some implementations, memory device 300 includes a plurality of memory planes 602 (e.g., four memory planes in FIG. 6). Memory plane 602 can be mutually independent in performing a read operation, a program operation, or an erase operation. For example, each memory plane 602 may be configured to perform a read operation independently in response to receiving a read control signal from control logic 512. In some implementations, each memory plane 602 covers local buffering for the read and program data and can process operations in parallel, thereby increasing the operation speed. To enable its independent operation, each memory plane 602 can include a set of blocks 304 of memory cell array 301 and a set of peripheral circuits, such as page buffer/sense amplifier 504, column decoder/bit line driver 506, and row decoder/word line driver 508.

Figure 7:
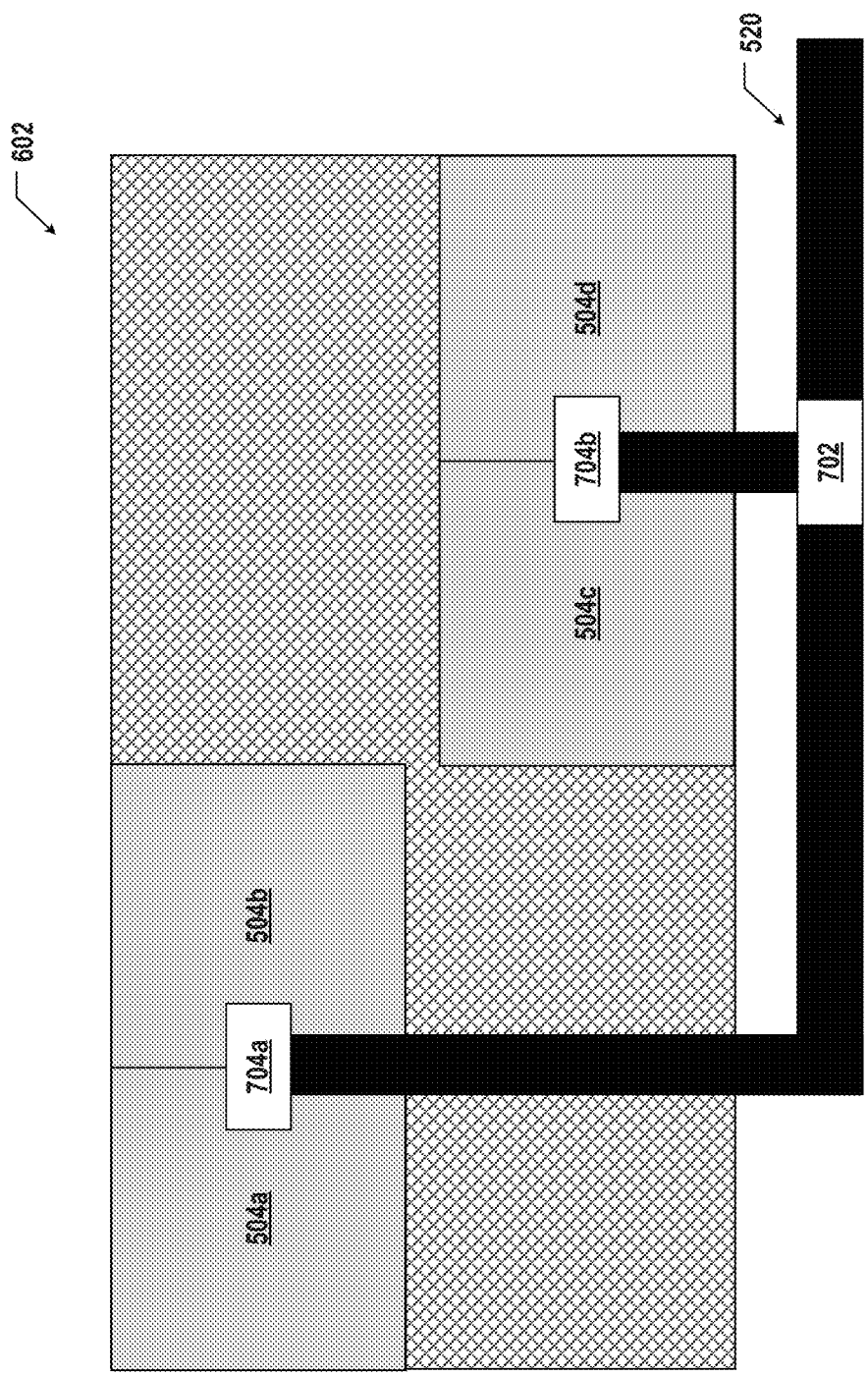
FIG. 7 illustrates an exemplary layout of a memory plane including a page buffer having multiple portions and a clock path coupled to the multiple portions of the page buffer, according to some aspects of the present disclosure.

FIG. 7 illustrates an exemplary layout of memory plane 602 including page buffer/sense amplifier 504 having multiple portions and clock path 520 coupled to the multiple portions of page buffer/sense amplifier 504, according to some aspects of the present disclosure. Memory plane 602 can include page buffer/sense amplifier 504 divided into a plurality of portions. As shown in FIG. 7, page buffer/sense amplifier 504 includes four physically separated quarters 504a, 504b, 504c, and 504d, according to some implementations. For ease of descriptions, the multiple portions of a page buffer may be described herein as four quarters. It is understood that the number of portions is not limited to four and may be any integer greater than 1 (e.g., 2, 3, 4, 5, 6, etc.), for example, two halves. Page buffer/sense amplifier 504 can include a plurality of storage units (e.g., latches, caches, or registers) for temporarily storing (buffering) one or more pages of data to be read from or written to the memory cells in memory plane 602. In some implementations, each quarter 504a, 504b, 504c, or 504d has the same size, i.e., one quarter of page buffer/sense amplifier 504. For example, page buffer/sense amplifier 504 may store 16K bytes of data, and each quarter 504a, 504b, 504c, or 504d may store 4K bytes of data.

In some implementations, clock path 520 is coupled to each quarter 504a, 504b, 504c, or 504d of page buffer/sense amplifier 504. As shown in FIG. 7, clock path 520 can diverge at each junction 702, 704a, or 704b to form branches thereof. For example, clock path 520 may diverge into two plane half branches at junction 702, and each plane half branch of clock path may respectively diverge into two quarter branches at a respective junction 704a or 704b, such that each of four quarter branches of clock path 520 may be coupled to a respective quarter 504a, 504b, 504c, or 504d of page buffer/sense amplifier 504. Clock path 520 can be bidirectional to transfer clock signals from, for example, control logic 512, to each quarter 504a, 504b, 504c, or 504d, and transfer clock return signals from each quarter 504a, 504b, 504c, or 504d to, for example, interface 516. In some implementations, clock path 520 is configured to split a clock signal into four clock signals and transfer the four clock signals to four quarters 504a, 504b, 504c, and 504d of page buffer/sense amplifier 504, respectively, via the quarter branches thereof. As described below in detail, clock path 520 is also configured to transfer four clock return signals from four quarters 504a, 504b, 504c, and 504d of page buffer/sense amplifier 504, respectively, via the quarter branches thereof, and merge the four clock return signals into a merged clock return signal.

Figure 8:
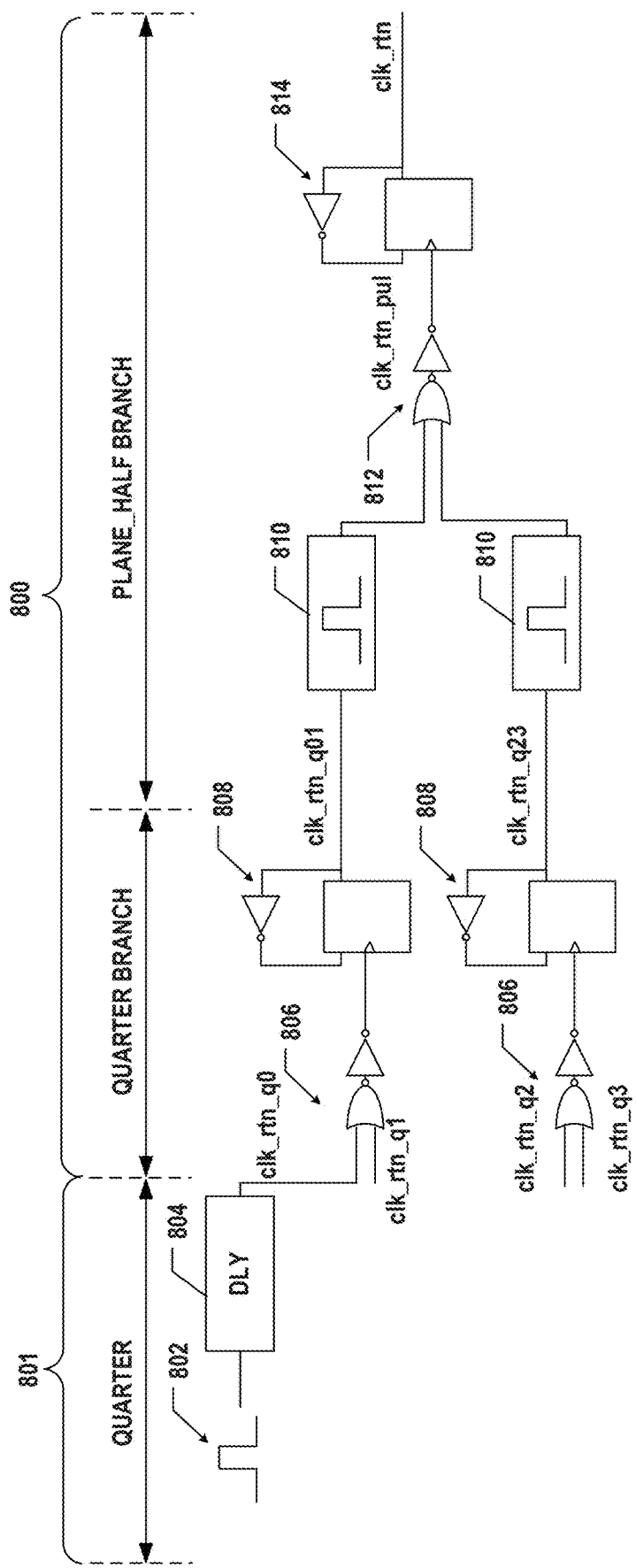
FIG. 8 illustrates a circuit diagram of a clock path coupled to multiple portions of a page buffer for merging clock return signals.
Figure 9:
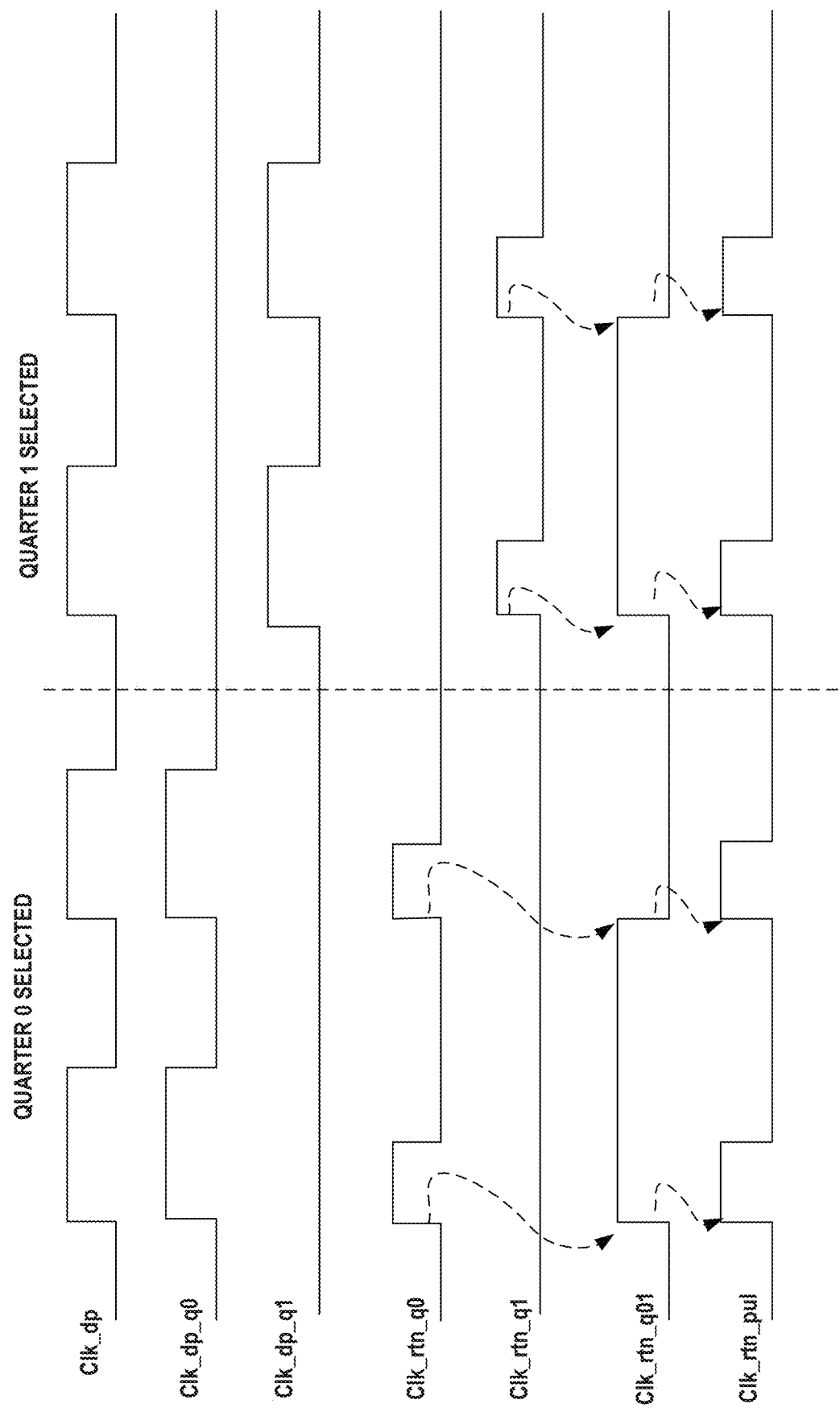
FIG. 9 illustrates a timing diagram of a clock signal return scheme implemented by the clock path in FIG. 8.

FIG. 8 illustrates a circuit diagram of a clock path 800 coupled to multiple portions of a page buffer 801 for merging clock return signals. FIG. 9 illustrates a timing diagram of a clock signal return scheme implemented by clock path 800 in FIG. 8. Each of quarters 0, 1, 2, and 3 of page buffer 801 is sequentially selected following this order: 0, 1, 2, and 3 in a read operation. Thus, taking quarters 0 and 1 as an example, as shown in FIG. 9, the clock signal (clk_dp) transferred on clock path 800 to page buffer 801 is split into two sequential clock signals (clk_dp_q0 and clk_dp_q1). That is, each of quarters 0 and 1 sequentially receives a respective clock signal (clk_dp_q0 or clk_dp_q1). As shown in FIG. 8, in each quarter 0, 1, 2, or 3, a respective clock signal 802 passes through a respective delay circuit (DLY) 804 to become a respective clock return signal (clk_rtn_q0, clk_rtn_q1, clk_rtn_q2, or clk_rtn_q3) in a respective branch of clock path 800. As shown in FIG. 9, for example, when quarter 0 is selected, delay circuit 804 for quarter 0 acts as a frequency multiplier to reduce the period of the first clock return signal (clk_rtn_q0) from that of the first clock signal (clk_dp_q0). Similarly, when quarter 1 is selected, delay circuit 804 for quarter 1 acts as a frequency multiplier to reduce the period of the second clock return signal (clk_rtn_q1) from that of the second clock signal (clk_dp_q1). As a result, clock return signals are transferred on clock path 800 in the forms of short pulses to ensure that the end level of each clock return signal when switching is low (e.g., 0 V, Vss) to avoid gating each other when merging at quarter branches of clock path 800 by OR gates 806. It is understood that although for ease of illustration, only delay circuit 804 is shown in page buffer 801 of FIG. 8, any other suitable components, for example, as described above, may be included in each quarter of page buffer 801.

As shown in FIG. 8, in each quarter branch of clock path 800, every two clock return signals from two quarters next to each other (e.g., quarters 0 and 1, or quarters 2 and 3) are merged by a respective OR gate 806. Each of the two merged clock return signals on a respective quarter branch of clock path 800 also passes a respective frequency divider 808 that increases its period to generate a respective merged clock return signal (clk_rtn_q01 or clk_rtn_q23). As shown in FIG. 9, OR gate 806 in conjunction with frequency divider 808 toggle the level of the merged clock return signal (clk_rtn_q01) at each rising edge of either clock return signal (clk_rtn_q0 or clk_rtn_q1). In other words, the short pulse of each clock return signal is enlarged after merging at each quarter branch.

As shown in FIG. 8, since the two merged clock return signals (clk_rtn_q01 or clk_rtn_q23) need to merge again in the plane half branch, clock path 800 also includes an edge detector/pulse generator 810 on each quarter branch that respectively generates a short pulse at each rising edge or falling edge of a respective merged clock return signal (clk_rtn_q01 or clk_rtn_q23). The two outputted signals are merged again by an OR gate 812 to generate a merged clock return signal (clk_rtn_pul). As shown in FIG. 9, short pulses are regenerated in the merged clock return signal (clk_rtn_pul) in response to the rising edges or falling edges of the merged clock return signal (clk_trn_q01). Referring back to FIG. 8, the merged clock return signal (clk_rtn_pul) needs to pass through a frequency divider 814 again on clock path 800 to increase the period, i.e., enlarging the short pulses, of the merged clock return signal (clk_rtn).

The clock signal return scheme described above with respect to FIGS. 8 and 9 requires short pulses in the various clock return signals (e.g., clk_rtn_q0, clk_rtn_q1, clk_rtn_q2, clk_rtn_q3, and clk_rtn_pul) to avoid gating at OR gates 806 and 812. Considering the process and operating condition variations (e.g., process, voltage, temperature, etc.) among different quarters, it becomes difficult to well control the short pulses that pass along a long routing line of clock path 800. Moreover, the frequent change of the signal periods and frequencies over clock path 800, for example, by frequency dividers, frequency multipliers, and/or edge detector/pulse generators, is also undesirable as it can increase the risk of mismatch between clock return signals and the corresponding data signals.

Figure 10:
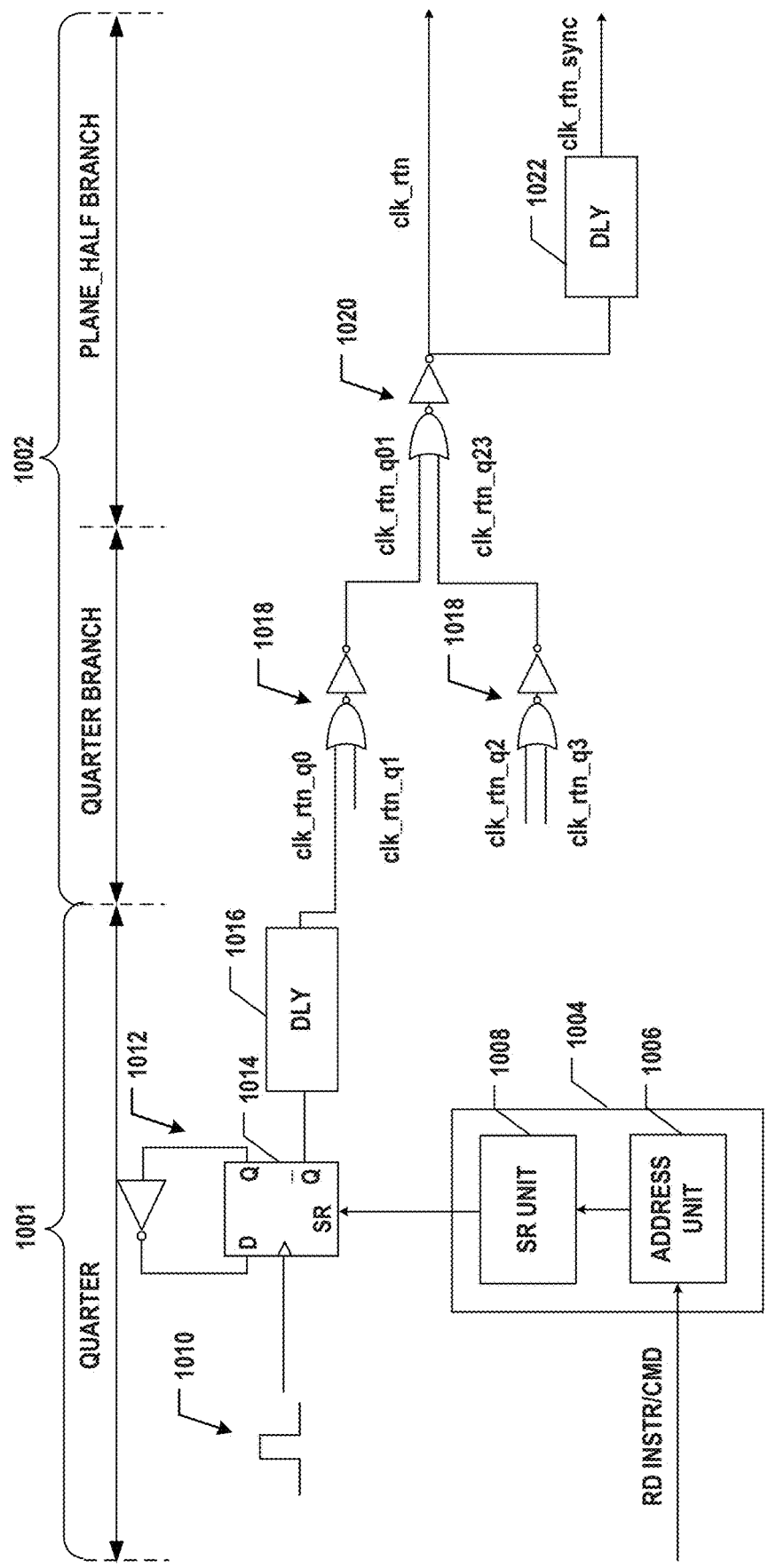
FIG. 10 illustrates a circuit diagram of an exemplary clock level set module and an exemplary clock path each coupled to multiple portions of a page buffer for merging clock return signals, according to some aspects of the present disclosure.
Figure 11:
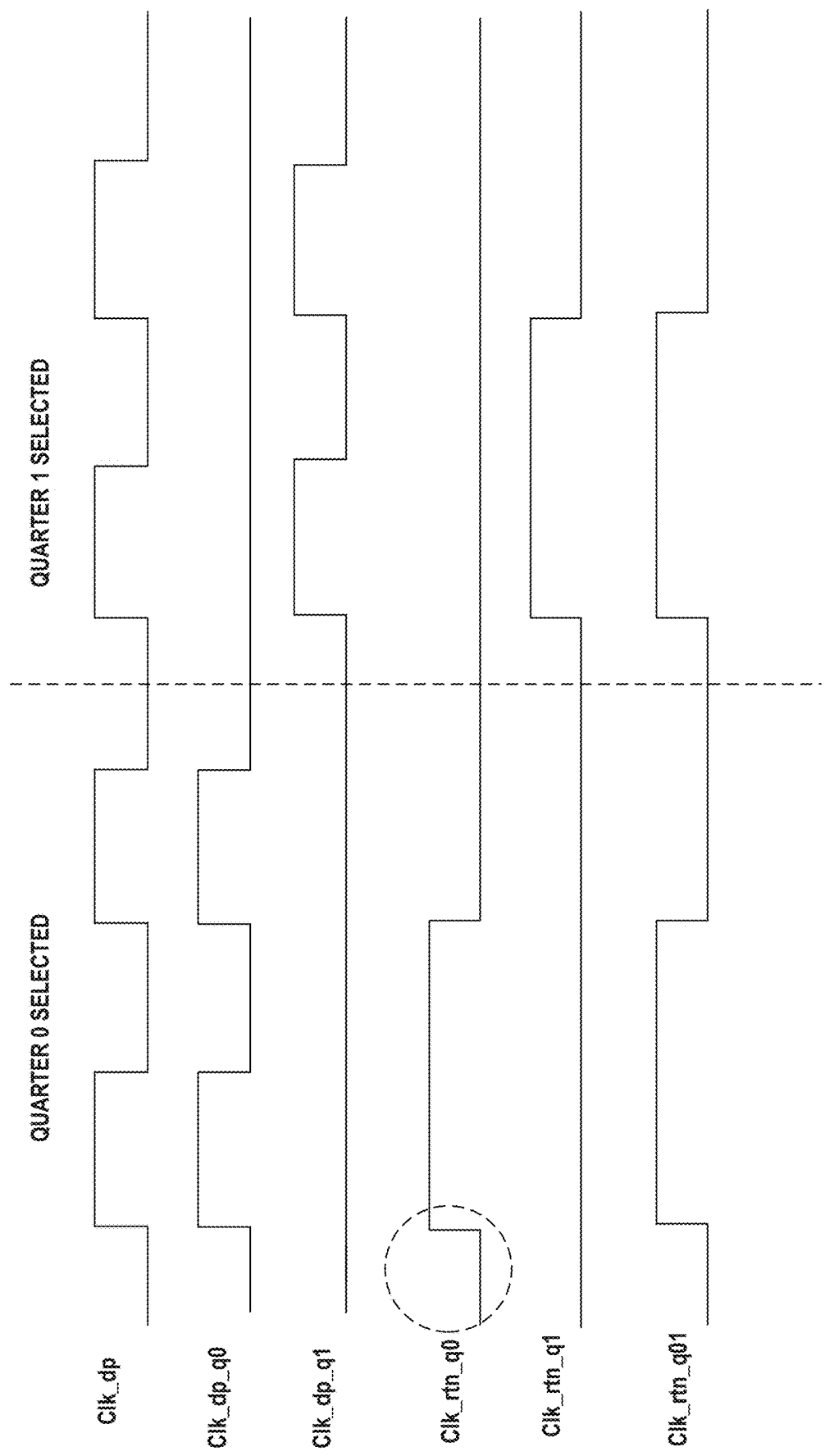
FIG. 11 illustrates a timing diagram of an exemplary clock signal return scheme implemented by the clock path in FIG. 10, according to some aspects of the present disclosure.

To overcome one or more of the above problems of the known clock signal return scheme, an improved clock signal return scheme is disclosed herein with respect to FIGS. 10 and 11 below. Depending on the type of logic gate used in the clock path for merging different clock return signals, for example, an OR gate or a NAND gate, the clock return signal returned from the current select portion can be ensured to finish at a particular level (e.g., low for OR gate and high for NAND gate) that will not gate another clock return signal next to it. As a result, a frequency divider can be used at the beginning of the clock path to increase the period of the clock return signal to avoid using short pulses for clock return signals. For example, FIG. 10 illustrates a circuit diagram of an exemplary clock level set module 1004 and an exemplary clock path 1002 each coupled to multiple portions of a page buffer 1001 for merging clock return signals, according to some aspects of the present disclosure, and FIG. 11 illustrates a timing diagram of an exemplary clock signal return scheme implemented by clock path 1002 in FIG. 10, according to some aspects of the present disclosure. Clock path 1002 and clock level set module 1004 can be parts of peripheral circuits 302 of memory device 300. Clock path 1002 may be one example of clock path 520 in FIG. 5. It is understood that although for ease of illustration, clock level set module 1004 is illustrated and described herein as a separate component coupled to page buffer 1001, clock level set module 1004 may be a standalone circuit or part of another peripheral circuit 302, such as part of page buffer 1001. For example, clock level set module 1004 may be part of page buffer/sense amplifier 504 or part of control logic 512 in FIG. 5.

Page buffer 1001 described with respect to FIGS. 10 and 11 may be, for example, page buffer/sense amplifier 504 in FIGS. 5-7 that includes a plurality of portions, such as four quarters 504a, 504b, 504c, and 504d in FIG. 7. Each quarter 504a, 504b, 504c, or 504d can be configured to sequentially receive a clock signal. For example, a clock signal (clk_dp) may be transferred from control logic 512 to page buffer/sense amplifier 504 and split into four clock signals (clk_dp_q0, clk_dp_q1, clk_dp_q2, and clk_dp_q3) by junctions 702, 704a, and 704b of clock path 520, which are respectively transferred to quarters 504a, 504b, 504c, and 504d through four quarter branches. Taking quarters 0 and 1 as an example, as shown in FIG. 11, quarter 0 may be first selected and receives a first clock signal (clk_dp_q0) of the clock signal (clk_dp) in a read operation. At the end of the first clock signal (clk_dp_q0), the current selected quarter may change from quarter 0 to quarter 1, which receives a second clock signal (clk_dp_q1) of the clock signal (clk_dp). It is understood that the clock signal timing may be similarly applied to quarters 2 and 3 when they are selected. It is also understood that the sequence of selecting each quarter, i.e., the sequence of receiving clock signals by the four quarters, may be preset, for example, in the order of quarters 0, 1, 2, and 3. It is further understood that depending on the specific read instruction, in a read operation, not all four quarters may always be selected. For example, depending on the starting address of the read data in page buffer/sense amplifier 504, the first selected quarter may be any one of quarters 0, 1, 2, and 3. Similarly, depending on the length of the read data as well, the last selected quarter may be any one of quarters 0, 1, 2, and 3.

Each quarter 504a, 504b, 504c, or 504d can also be configured to sequentially return a clock return signal in response to receiving the corresponding clock signal. That is, in some implementations, each quarter 504a, 504b, 504c, or 504d returns a clock return signal once the corresponding clock signal is received, i.e., following the wave pipeline structure as described above. The sequence of returning the clock return signals by the four quarters can thus be the same as the sequence of receiving the clock signals by the four quarters, as well as the sequence of selecting each quarter. It is understood that the sequence of returning the clock return signals by the four quarters may be thus preset as well, for example, in the order of quarters 0, 1, 2, and 3.

In some implementations, clock path 1002 is coupled to the plurality of portions of page buffer 1001 and configured to merge the plurality of clock return signals. For example, clock path 1002 may be coupled to the four quarters of page buffer 1001 and configured to merge the four clock return signals sequentially returned from the four quarters. It is understood that in some examples, not all four quarters may be selected in a read operation depending on the read instructions and thus, clock path 1002 may merge only some of the four clock return signals accordingly in those examples. Nevertheless, clock path 1002 can be capable of merging all four clock return signals sequentially returned from the four quarters when the four quarters are all selected in read operations.

In some implementations, clock level set module 1004 is coupled to each quarter of page buffer 1001 and configured to set the start level of a first clock return signal of the plurality of clock return signals based on the number of cycles in a first clock signal of the plurality of clock signals. The first clock return signal can correspond to the first clock signal. The first clock signal is sent to the current selected portion of page buffer 1001 in a read operation based on the read instruction, and the first clock return signal is returned by the current selected portion of page buffer 1001 in response to receiving the first clock signal, according to some implementations. As a result, the end level of the first clock return signal can be set at a level that would not gate the second clock return signal next to the first clock return signal when the first and second clock return signals are merged by clock path 1002, as described below in detail.

In some implementations, each quarter of page buffer 1001 includes a frequency divider 1012 coupled to clock level set module 1004. Each frequency divider 1012 can be configured to receive a respective clock signal 1010 (e.g., clk_dp_q0 or clk_dp_q1 in FIG. 11) and generate the respective clock return signal (clk_rtn_q0, clk_rtn_q1, clk_rtn_q2, or clk_rtn_q3) based on clock signal 1010. As shown in FIG. 10, in some implementations, frequency divider 1012 includes a flip-flop 1014 coupled to clock level set module 1004. For example, flip-flop 1014 may be a D flip-flop (DFF) with set/reset (SR). The DFF with SR may include a clock input, an SR input, a D input, a Q output and a Q output. The Q output of the DFF may be coupled to the D input via an inverter, and the Q output of the DFF may output the respective clock return signal (clk_rtn_q0, clk_rtn_q1, clk_rtn_q2, or clk_rtn_q3). The clock input of the DFF may receive the respective clock signal (clk_dp_q0, clk_dp_q1, clk_dp_q2, or clk_dp_q3), and the SR input of the DFF may receive an SR signal from clock level set module 1004. Also referring to FIG. 11, taking quarters 0 and 1, for example, when quarter 0 is selected, frequency divider 1012 coupled to quarter 0 can double the period of the first clock return signal (clk_rtrn_q0) from the period of the first clock signal (clk_dp_q0) to avoid transferring short pulses on clock path 1002. For example, the duty cycle of the first clock return signal (clk_rtrn_q0) may be 50%. Similarly, when the current select quarter switches from quarter 0 to quarter 1, frequency divider 1012 coupled to quarter 1 can double the period of the second clock return signal (clk_rtrn_q1) from the period of the second clock signal (clk_dp_q1) as well. It is understood although only frequency divider 1012 coupled to one of the quarters of page buffer 1001 is shown in FIG. 10 for ease of illustration, frequency divider 1012 may be similarly coupled to each of the four quarters of page buffer 1001.

Instead of using short pulses in clock return signals to avoid gating the clock return signals next to each other when merging the clock return signals (when switching the current select quarters), clock level set module 1004 in conjunction with frequency dividers 1012 can ensure that the end level of the clock return signal is at a level (either at a high level, e.g., Vdd, or at a low level, e.g., 0 V or Vss) that would not gate the subsequent clock return signal by setting the suitable start level of the clock return signal. In some implementations, to set the start level of the first clock return signal, clock level set module 1004 is configured to determine the parity of the number of cycles in the first clock signal based on an address of the page buffer associated with the first clock signal, and set the start level of the first clock return signal based on the parity. The address can be in a read instruction. Since the level of the clock return signal is toggled at each rising edge of the respective clock signal by frequency divider 1012, the parity (odd or even) of the number of cycles in the clock signal, as well as the start level (high or low) of the clock return signal determine the end level (high or low) of the clock return signal, according to some implementations. For example, the start and end levels of the clock return signal may be the same if the parity of the number of cycles in the clock signal is even, while the start and end levels of the clock return signal may be different if the parity of the number of cycles in the clock signal is odd.

As shown in FIG. 10, in some implementations, clock level set module 1004 includes an address unit 1006 configured to receive a read instruction or a read command including the starting address of the data to be read from page buffer/sense amplifier 504, and determine the parity of the number of cycles in the clock signal. As described above, clock level set module 1004 can be part of page buffer/sense amplifier 504, for example, as a dedicated integrated circuit (IC), such as an application-specific integrated circuit (ASIC), or can be part of control logic 512, for example, as a dedicated IC or firmware/software code running on a microcontroller unit (MCU). Thus, address unit 1006 can either receive the read instruction from a memory controller (e.g., 106 in FIG. 1) when clock level set module 1004 is part of control logic 512, or receive a read command (control signals) from control logic 512 based on the read instruction from the memory controller when clock level set module 1004 is part of page buffer/sense amplifier 504. Nevertheless, address unit 1006 is capable of identifying the starting address of the data to be read in the read operation in one of the four quarters of page buffer/sense amplifier 504. In some implementations, the number of cycles in the first clock signal corresponds to the number of data units transferred in the corresponding portion of page buffer 1001 with the first clock signal. That is, the clock signals can be synchronized with the data signals. Thus, based on the starting address in a read instruction, address unit 1006 can determine the number of cycles in the clock signal sent to the current selected quarter. In some implementations, address unit 1006 determines the parity based on the lowest bit of the address of the read data in a read instruction.

Figure 12:
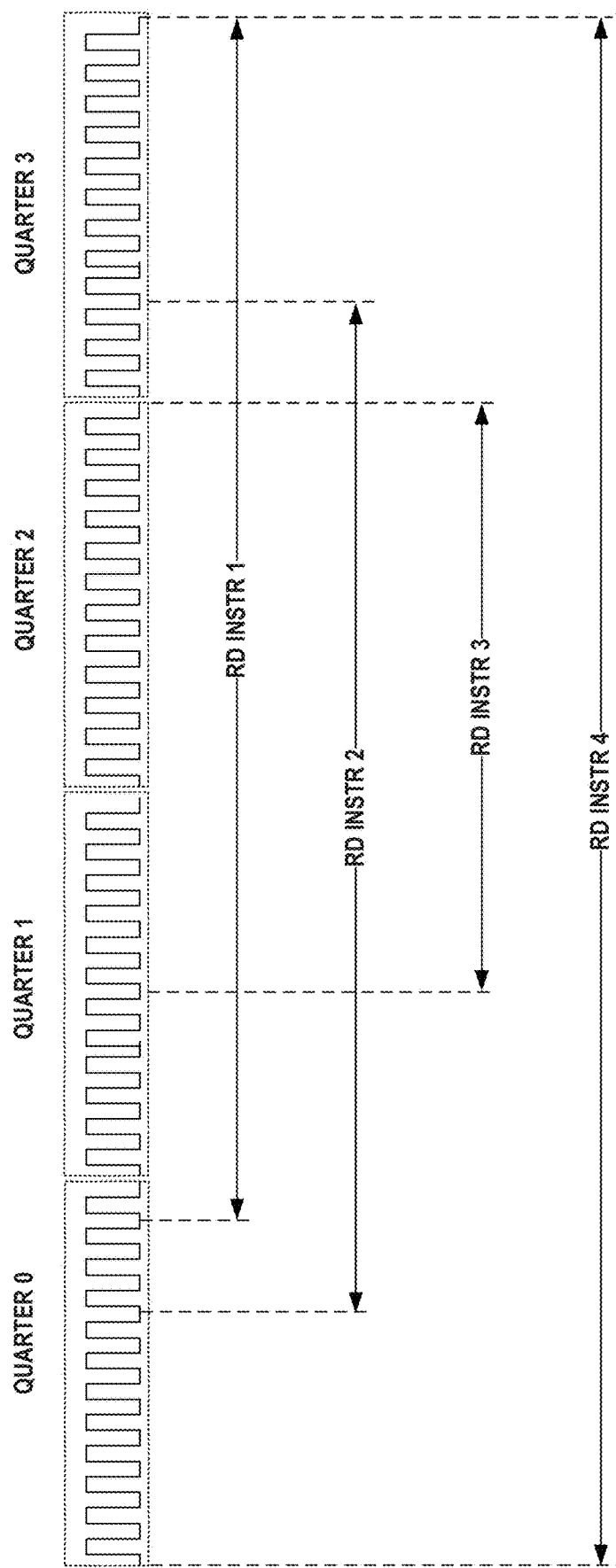
FIG. 12 illustrates an exemplary scheme of determining start levels of clock return signals based on an address of a page buffer in a read instruction, according to some aspects of the present disclosure.

For example, as shown in FIG. 12, for each of read instructions 1, 2, and 4, the starting address may be in quarter 0, which becomes the first select quarter. In read instruction 1, clock level set module 1004 may determine that there is an odd number (1) of cycle in the clock signal sent to quarter 0, which will make the start and end levels of the clock return signal from quarter 0 to be different. In read instruction 2 or 4, clock level set module 1004 may determine that there is an even number (4 or 12) of cycles in the clock signal coupled to quarter 0, which will make the start and end levels of the clock return signal from quarter 0 to be the same. It is understood that the starting address may not always be in quarter 0. For example, for instruction 3, the starting address may be in quarter 1, and clock level set module 1004 may determine that there is an even number (6)

of cycles in the clock signal coupled to quarter 1, which will make the start and end levels of the clock return signal from quarter 1 to be the same.

Referring back to FIG. 10, in some implementations, clock level set module 1004 includes an SR unit 1008 configured to generate the SR signal to the SR input of flip-flop 1014 based on the parity of the number of cycles in the clock signal. By setting or resetting flip-flop 1014 (e.g., the DFF with SR) with the appropriate SR signal (high or low), the start level of the output, i.e., the first clock return signal, can be set to either high or low. Another factor taken into consideration when determining the appropriate SR signal for setting the start level of the first clock return signal is the way how the clock return signals are merged by clock path 1002. Clock path 1002 can include either an OR gate or a NAND gate configured to merge two clock return signals. Thus, clock level set module 1004 can be further configured to set the start level of the first clock return signal based on the parity and whether the clock return signals are merged by the OR gate or the NAND gate. Gating may occur at an OR gate when the end level of first clock return signal is high, or at a NAND gate when the end level of the first clock return signal is low. In some implementations, the end level of the first clock return signal is low in response to clock path 1002 including an OR gate to avoid gating at the OR gate. In some implementations, the end level of the first clock return signal is high in response to clock path 1002 including a NAND gate to avoid gating at the NAND gate.

As shown in FIG. 10, clock path 1002 includes two OR gates 1018 each configured to merge two clock return signals (clk_rtn_q0 and clk_rtn_q1, or clk_rtn_q2 and clk_rtn_q3) and generate a merged clock return signal (clk_rtn_q01 or clk_rtn_q23). As shown in FIG. 11, for current select quarter 0, since the parity of the number (2) of cycles in the first clock signal (clk_dp_q0) is even, and the first and second clock return signals (clk_rtn_q0 and clk_rtn_q1) is merged by OR gate 1018, the start level of the first clock return signal (clk_rtn_q0) may be set to low, such that the end level of the first clock return signal (clk_rtn_q0) may remain low to avoid gating the second clock return signal (clk_rtn_q0) next to the first clock return signal (clk_rtn_q0). As a result, the merged clock return signal (clk_rtn_q01) may be generated without the concern of gating even when short pulses are not used in the first or second clock return signal (clk_rtn_q0 or clk_rtn_q1).

In some implementations, clock level set module 1004 is further configured to set the start level of a second clock return signal next to the first clock return signal to low in response to clock path 1002 including an OR gate, and set the start level of the second clock return signal to high in response to clock path 1002 including a NAND gate. That is, for the subsequent quarter next to the current select quarter, assuming the parity of the number of data units (the number of cycles of the corresponding clock signal) to be transferred in the entire quarter is preset to be even (e.g., 4K bytes), since the start and end levels of the corresponding clock return signal would be the same, clock level set module 1004 can determine the start level of the corresponding clock return signal based on whether the first and second clock return signals are merged by an OR gate or AND gate alone. In case the data transferred in the subsequent quarter may not occupy the entire quarter, i.e., no further quarter and clock return signals may be needed in the read operation, the gating would not be an issue for the second clock return signal then since no more merging is needed.

For example, as shown in FIG. 12, for read instruction 1 or 4, since the data to be read covers the entirety of each of quarter 1, 2, and 3 (selected after the current select quarter 0), assuming OR gates are used for merging clock return signals, clock level set module 1004 may set the start level of each clock return signal from quarter 1, 2, or 3 to low. For read instruction 3, since the data to be read covers the entirety of quarter 2 (selected after the current select quarter 1), clock level set module 1004 may set the start level of the clock return signal from quarter 2 to low. As to read instruction 2, since the data to be read covers the entirety of each of quarters 1 and 2 (selected after the current select quarter 0), but a part of quarter 3, clock level set module 1004 may set the start level of the clock return signal from quarter 2 to low and set the start level of the clock return signal from quarter 3 to any level as there is no more clock return signal next to it.

Referring back to FIG. 10, clock path 1002 can further include an OR gate 1020 configured to further merge the two merged clock return signals (clk_rtn_q01 and clk_rtn_q23) to generate a merged clock return signal (clk_rtn) that merges the four clock return signals (clk_rtn_q0, clk_rtn_q1, clk_rtn_q2, and clk_rtn_q3) from the four quarters. In some implementations, clock path 1002 further includes one or more delay circuits, for example, a delay circuit 1016 after each frequency divider 1012, and a delay circuit 1022 after OR gate 1020, to synchronize the clock return signals with corresponding data signals in case a misalignment occurs during the transfer of the clock return signals by clock path 1002. For example, the merged clock return signal (clk_rtn) may become a synchronized merged clock return signal (clk_rtn_srync) after passing delay circuit 1022 to be used for reading the aligned data signals.

Figure 13:
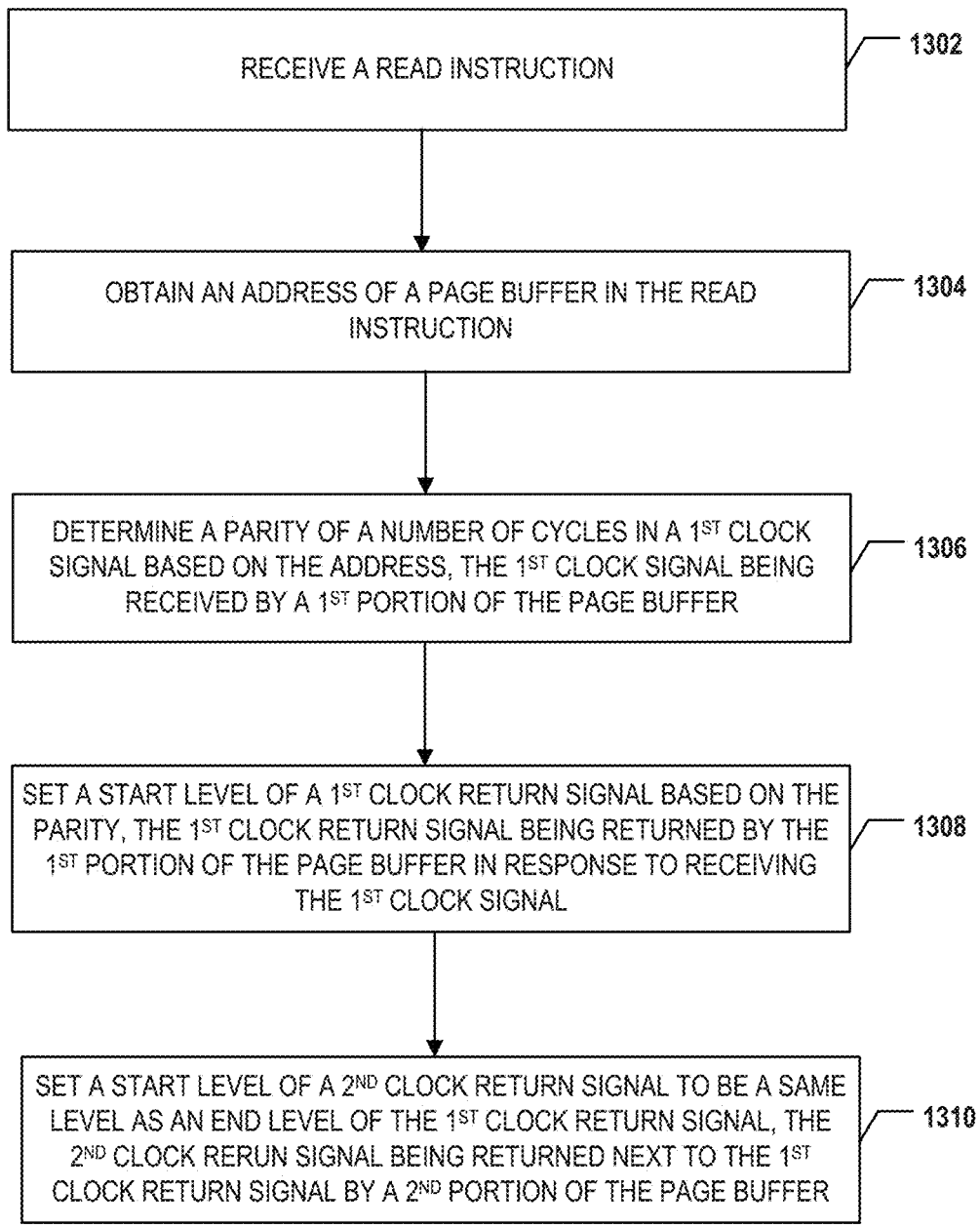
FIG. 13 illustrates a flowchart of an exemplary method for operating a memory device, according to some aspects of the present disclosure.

FIG. 13 illustrates a flowchart of a method 1300 for operating a memory device, according to some aspects of the present disclosure. The memory device may be any suitable memory device disclosed herein, such as memory device 300. Method 1300 may be implemented by clock level set module 1004. It is understood that the operations shown in method 1300 may not be exhaustive and that other operations can be performed as well before, after, or between any of the illustrated operations. Further, some of the operations may be performed simultaneously, or in a different order than shown in FIG. 13.

Referring to FIG. 13, method 1300 starts at operation 1302, in which a read instruction is received. For example, control logic 512 of memory device 300 may receive a read instruction from memory controller 106 in a read operation. Method 1300 proceeds to operation 1304, as illustrated in FIG. 13, in which an address of the page buffer is obtained in the read instruction. For example, clock level set module 1004 of memory device 300 may obtain the starting address of data to be read from page buffer/sense amplifier 504 in the read instruction. Method 1300 proceeds to operation 1306, as illustrated in FIG. 13, in which a parity of a number of cycles in a first clock signal is determined based on the address. The first clock signal is received by a first portion of the page buffer. The number of cycles in the first clock signal can correspond to a number of data units transferred in the first portion of the page buffer with the first clock signal. For example, clock level set module 1004 of memory device 300 may determine the parity of the number of cycles in the clock signal sent to the current select quarter based on the starting address.

Method 1300 proceeds to operation 1308, as illustrated in FIG. 13, in which a start level of a first clock return signal is set based on the parity. The first clock return signal is returned by the first portion of the page buffer in response to receiving the first clock signal. The duty cycle of the first clock return signal can be 50%. For example, clock level set module 1004 and frequency divider 1012 of memory device 300 may set the start level of the clock return signal from the current select quarter based on the parity. Method 1300 proceeds to operation 1310, as illustrated in FIG. 13, in which a start level of a second clock return signal is set to be a same level as an end level of the first clock return signal. The second clock return signal is returned next to the first clock return signal by a second portion of the page buffer. For example, clock level set module 1004 and another frequency divider 1012 of memory device 300 may set the start level of the subsequent clock return signal from the next select quarter to be the same level as the end level of the clock return signal.

According to one aspect of the present disclosure, a circuit includes a page buffer including a plurality of portions, a clock path coupled to the plurality of portions of the page buffer, and a clock level set module coupled to the page buffer. Each of the portions is configured to sequentially receive a clock signal, and sequentially return a clock return signal in response to receiving the corresponding clock signal. The clock path is configured to merge the plurality of clock return signals. The clock level set module is configured to set a start level of a first clock return signal of the plurality of clock return signals based on a number of cycles in a first clock signal of the plurality of clock signals. The first clock return signal corresponds to the first clock signal.

In some implementations, to set the start level of the first clock return signal, the clock level set module is configured to determine a parity of the number of cycles in the first clock signal based on an address of the page buffer associated with the first clock signal, and set the start level of the first clock return signal based on the parity.

In some implementations, the address is in a read instruction.

In some implementations, the clock path includes an OR gate or a NAND gate configured to merge the plurality of clock return signals.

In some implementations, an end level of the first clock return signal is low in response to the clock path including the OR gate, and the end level of the first clock return signal is high in response to the clock path including the NAND gate.

In some implementations, the clock level set module is further configured to set a start level of a second clock return signal of the plurality of clock return signals to low in response to the clock path including the OR gate, and set the start level of the second clock return signal to high in response to the clock path including the NAND gate. The second clock return signal can be returned next to the first clock return signal.

In some implementations, each portion of the page buffer includes a frequency divider configured to receive the respective clock signal and generate the respective clock return signal based on the clock signal.

In some implementations, each frequency divider includes a flip-flop coupled to the clock level set module. In some implementations, the flip-flop includes a clock input receiving the respective clock signal, and a set/reset input receiving a set/reset signal from the clock level set module.

In some implementations, a duty cycle of the first clock return signal is 50%.

In some implementations, the number of cycles in the first clock signal corresponds to a number of data units transferred in the corresponding portion of the page buffer with the first clock signal.

According to another aspect of the present disclosure, a system includes a memory device including a memory cell array configured to store data, and a peripheral circuit coupled to the memory cell array and configured to perform a read operation on the memory cell array to read the stored data. The peripheral circuit includes a page buffer including a plurality of portions, a clock path coupled to the plurality of portions of the page buffer, and a clock level set module coupled to the page buffer. Each of the portions is configured to sequentially receive a clock signal, and sequentially return a clock return signal in response to receiving the corresponding clock signal. The clock path is configured to merge the plurality of clock return signals. The clock level set module is configured to set a start level of a first clock return signal of the plurality of clock return signals based on a number of cycles in a first clock signal of the plurality of clock signals. The first clock return signal corresponds to the first clock signal.

In some implementations, the system includes a memory controller coupled to the memory device and configured to provide a read instruction to the peripheral circuit to control the read operation.

In some implementations, the system includes a host coupled to the memory controller and configured to receive the read data.

In some implementations, to set the start level of the first clock return signal, the clock level set module is configured to determine a parity of the number of cycles in the first clock signal based on an address of the page buffer associated with the first clock signal, and set the start level of the first clock return signal based on the parity.

In some implementations, the address is in a read instruction.

In some implementations, the clock path includes an OR gate or a NAND gate configured to merge the plurality of clock return signals.

In some implementations, an end level of the first clock return signal is low in response to the clock path including the OR gate, and the end level of the first clock return signal is high in response to the clock path including the NAND gate.

In some implementations, the clock level set module is further configured to set a start level of a second clock return signal of the plurality of clock return signals to low in response to the clock path including the OR gate, and set the start level of the second clock return signal to high in response to the clock path including the NAND gate. The second clock return signal can be returned next to the first clock return signal.

In some implementations, each portion of the page buffer includes a frequency divider configured to receive the respective clock signal and generate the respective clock return signal based on the clock signal.

In some implementations, each frequency divider includes a flip-flop coupled to the clock level set module. In some implementations, the flip-flop includes a clock input receiving the respective clock signal, and a set/reset input receiving a set/reset signal from the clock level set module.

In some implementations, a duty cycle of the first clock return signal is 50%.

In some implementations, the number of cycles in the first clock signal corresponds to a number of data units transferred in the corresponding portion of the page buffer with the first clock signal.

According to still another aspect of the present disclosure, a memory device includes a memory cell array configured to store data, and a peripheral circuit coupled to the memory cell array and configured to perform a read operation on the memory cell array to read the stored data. The peripheral circuit includes a page buffer including a plurality of portions, a clock path coupled to the plurality of portions of the page buffer, and a clock level set module coupled to the page buffer. Each of the portions is configured to sequentially receive a clock signal, and sequentially return a clock return signal in response to receiving the corresponding clock signal. The clock path is configured to merge the plurality of clock return signals. The clock level set module is configured to set a start level of a first clock return signal of the plurality of clock return signals based on a number of cycles in a first clock signal of the plurality of clock signals. The first clock return signal corresponds to the first clock signal.

According to yet another aspect of the present disclosure, a method for operating a memory device is disclosed. The memory device includes a page buffer. A read instruction is received. An address of the page buffer in the read instruction is obtained. A parity of a number of cycles in a first clock signal is determined based on the address. The first clock signal is received by a first portion of the page buffer. A start level of a first clock return signal is set based on the parity. The first clock return signal is returned by the first portion of the page buffer in response to receiving the first clock signal.

In some implementations, a start level of a second clock return signal is set to be a same level as an end level of the first clock return signal. The second clock return signal can be returned next to the first clock return signal by a second portion of the page buffer.

In some implementations, a duty cycle of the first clock return signal is 50%.

In some implementations, the number of cycles in the first clock signal corresponds to a number of data units transferred in the first portion of the page buffer with the first clock signal.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A circuit, comprising:
   a page buffer comprising a plurality of portions, each of the portions being configured to sequentially receive a clock signal, and sequentially return a clock return signal in response to receiving the corresponding clock signal;
   a clock path coupled to the plurality of portions of the page buffer and configured to merge the plurality of clock return signals; and
   a clock level set module coupled to the page buffer and configured to set a start level of a first clock return signal of the plurality of clock return signals based on a number of cycles in a first clock signal of the plurality of clock signals, the first clock return signal corresponding to the first clock signal.

2. The circuit of claim 1, wherein to set the start level of the first clock return signal, the clock level set module is configured to determine a parity of the number of cycles in the first clock signal based on an address of the page buffer associated with the first clock signal, and set the start level of the first clock return signal based on the parity.

3. The circuit of claim 2, wherein the address is in a read instruction.

4. The circuit of claim 2, wherein the clock path comprises an OR gate or a NAND gate configured to merge the plurality of clock return signals.

5. The circuit of claim 4, wherein the clock level set module is further configured to set the start level of the first clock return signal based on the parity and whether the clock return signals are merged by the OR gate or the NAND gate.

6. The circuit of claim 5, wherein an end level of the first clock return signal is low in response to the clock path comprising the OR gate, and the end level of the first clock return signal is high in response to the clock path comprising the NAND gate.

7. The circuit of claim 4, wherein the clock level set module is further configured to set a start level of a second clock return signal of the plurality of clock return signals to low in response to the clock path comprising the OR gate, and set the start level of the second clock return signal to high in response to the clock path comprising the NAND gate, the second clock return signal being returned next to the first clock return signal.

8. The circuit of claim 1, wherein each portion of the page buffer comprises a frequency divider configured to receive the respective clock signal and generate the respective clock return signal based on the clock signal.

9. The circuit of claim 8, wherein each frequency divider comprises a flip-flop coupled to the clock level set module, the flip-flop comprising a clock input receiving the respective clock signal, and a set/reset input receiving a set/reset signal from the clock level set module.

10. The circuit of claim 1, wherein a duty cycle of the first clock return signal is 50%.

11. The circuit of claim 1, wherein the number of cycles in the first clock signal corresponds to a number of data units transferred in the corresponding portion of the page buffer with the first clock signal.

12. A system, comprising:
    a memory device comprising a memory cell array configured to store data, and a peripheral circuit coupled to the memory cell array and configured to perform a read operation on the memory cell array to read the stored data, the peripheral circuit comprising:
    a page buffer comprising a plurality of portions, each of the portions being configured to sequentially receive a clock signal, and sequentially return a clock return signal in response to receiving the corresponding clock signal;
    a clock path coupled to the plurality of portions of the page buffer and configured to merge the plurality of clock return signals; and
    a clock level set module coupled to the page buffer and configured to set a start level of a first clock return signal of the plurality of clock return signals based on a number of cycles in a first clock signal of the plurality of clock signals, the first clock return signal corresponding to the first clock signal.

13. The system of claim 12, further comprising a memory controller coupled to the memory device and configured to provide a read instruction to the peripheral circuit to control the read operation.

14. The system of claim 13, further comprising a host coupled to the memory controller and configured to receive the read data.

15. The system of claim 13, wherein to set the start level of the first clock return signal, the clock level set module is configured to determine a parity of the number of cycles in the first clock signal based on an address of the page buffer associated with the first clock signal, and set the start level of the first clock return signal based on the parity.

16. The system of claim 15, wherein the address is in the read instruction provided by the memory controller.

17. A method for operating a memory device comprising a page buffer, the method comprising:
receiving a read instruction;
obtaining an address of the page buffer in the read instruction;
determining a parity of a number of cycles in a first clock signal based on the address, the first clock signal being received by a first portion of the page buffer; and
setting a start level of a first clock return signal based on the parity, wherein the first clock return signal is returned by the first portion of the page buffer in response to receiving the first clock signal.

18. The method of claim 17, further comprising setting a start level of a second clock return signal to be a same level as an end level of the first clock return signal, wherein the second clock return signal is returned next to the first clock return signal by a second portion of the page buffer.

19. The method of claim 17, wherein a duty cycle of the first clock return signal is 50%.

20. The method of claim 17, wherein the number of cycles in the first clock signal corresponds to a number of data units transferred in the first portion of the page buffer with the first clock signal.

* * * * *